United States Patent
Hori et al.

(10) Patent No.: US 6,209,109 B1
(45) Date of Patent: Mar. 27, 2001

(54) CODE SYNCHRONIZATION DECISION CIRCUIT OF VITERBI DECODER

(75) Inventors: Michiru Hori; Masayuki Koyama, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/227,581

(22) Filed: Jan. 8, 1999

(30) Foreign Application Priority Data

Aug. 4, 1998 (JP) ................................................ 10-220725

(51) Int. Cl.$^7$ ...................................................... G06F 11/00
(52) U.S. Cl. ........................... 714/707; 714/704; 714/795
(58) Field of Search ................................... 714/707, 704, 714/795

(56) References Cited

U.S. PATENT DOCUMENTS 5,054,035 * 10/1991 Tarallo et al. ........................ 375/225
5,671,228 * 9/1997 Nagashima ........................... 714/704

FOREIGN PATENT DOCUMENTS 6260945   9/1994 (JP).

* cited by examiner

Primary Examiner—Phung M. Chung
(74) Attorney, Agent, or Firm—Leydig, Voit & Mayer, Ltd.

(57) ABSTRACT

A code synchronization decision circuit of Viterbi decoder including a trigger signal generator that produces a trigger signal every time a symbol counter counts a predetermined number of symbols defined externally. A second comparator compares, in response to the trigger signal, the number of errors of symbols counted by an error counter with a threshold value that is externally set, and supplies a masking signal generator with a synchronization signal or a slip signal in response of the compared result. The masking signal generator, in response to the signals, generates a masking signal for suspending the operation of the error counter and symbol counter for a time period, during which unsuitable codes will be supplied to the code synchronization decision circuit from a re-encoder of the Viterbi decoder as one of compared values for detecting symbol errors. This makes it possible for a user to set the threshold value and the number of symbols to be counted with ease, and to implement a code synchronization decision circuit of a Viterbi decoder capable of saving power.

6 Claims, 5 Drawing Sheets

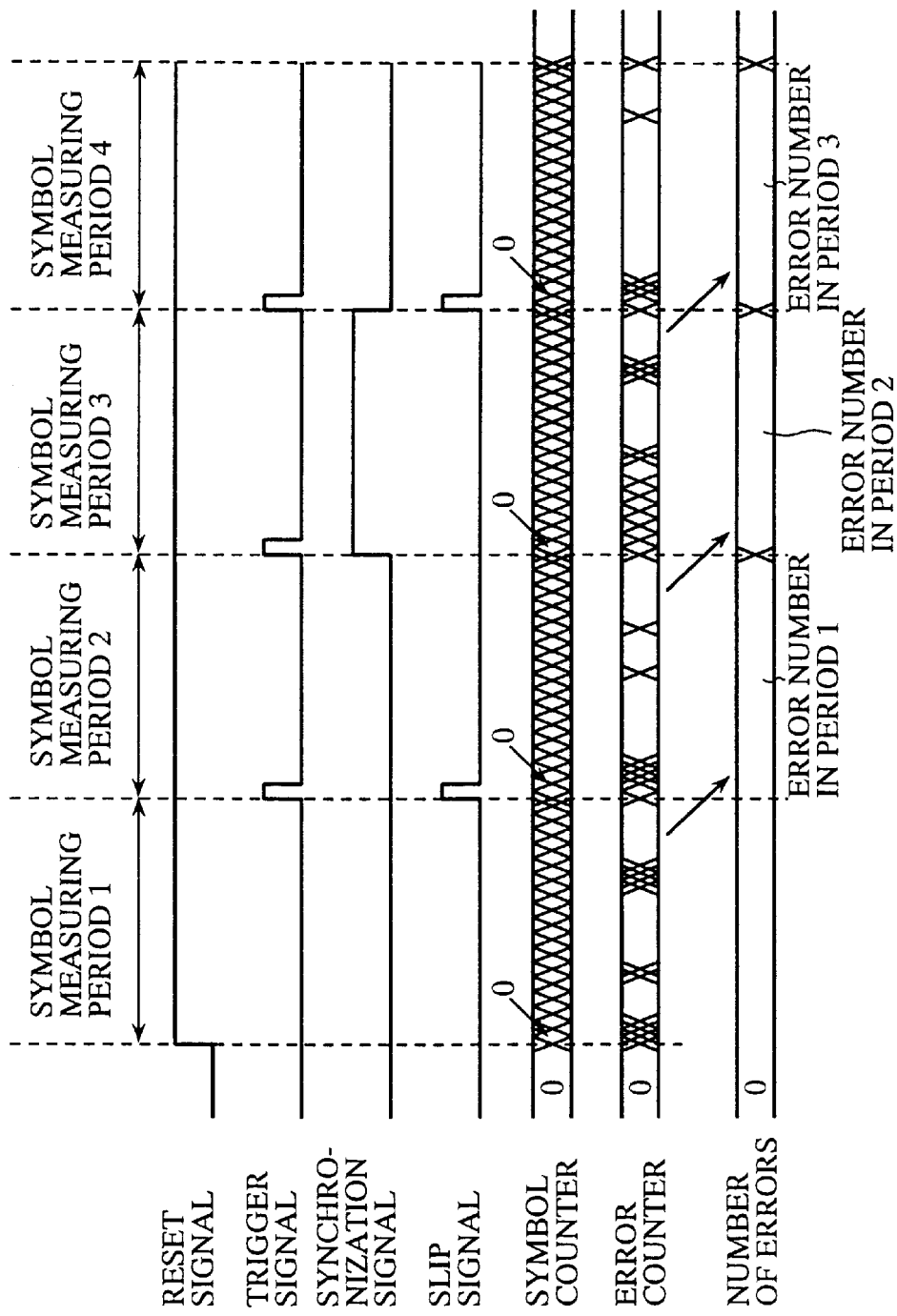

CODE SYNCHRONIZATION DECISION CIRCUIT OF VITERBI DECODER

BACKGROUND OF THE INVENTION

1. Field of the Invention

The present invention relates to a code synchronization decision circuit of a Viterbi decoder for deciding as to whether or not code synchronization is established in the Viterbi decoder which is employed in a digital transmission system.

2. Description of Related Art

FIG. 5 is a timing chart showing timings of code synchronization decision operation by a conventional code synchronization decision circuit of a Viterbi decoder. As illustrated in FIG. 5, the conventional code synchronization decision circuit of the Viterbi decoder counts the number of errors of symbols over a fixed symbol measuring period, and compares the count value with a predetermined error number (called threshold value from now on). As a result, if the count value does not exceed the threshold value, a decision is made that the code synchronization is established, and otherwise a decision is made that the code synchronization is not established. If the code synchronization is not established, the Viterbi decoder cannot decode a convolutional code correctly. Accordingly, when the code synchronization decision circuit decides that the code synchronization is not established, it outputs a signal notifying of that.

Generally, the conventional code synchronization decision circuit continues counting the number of errors for each symbol measuring period by keeping operation of both the error counter and symbol counter for deciding the code synchronization even during a time period in which a re-encoder that re-encodes the decoded output of the Viterbi decoder produces a signal inappropriate for counting the number of errors immediately after the start of operation, or immediately after the detection of a slip signal notifying that the code synchronization is lost.

As documents disclosing a conventional code synchronization decision circuit of the Viterbi decoder, Japanese patent application laid-open Nos. 5-206872/1993 and 6-260945/1994 are known.

The conventional code synchronization decision circuit of the Viterbi decoder with such an arrangement has the following problems. First, it is difficult for transmission line characteristics a user considered to be correctly reflected on settings when the user establishes the threshold value and the number of symbols counted by the symbol counter. Second, rather much power is wasted by the idle operation during the time period in which the inappropriate signal is supplied for the error counter to count the number of errors.

SUMMARY OF THE INVENTION

The present invention is implemented to solve the foregoing problems. It is therefore an object of the present invention to provide a code synchronization decision circuit of the Viterbi decoder capable of not only enabling a user to set the threshold value and the number of symbols correctly and easily, but also reducing its consumption power.

According to a first aspect of the present invention, there is provided a code synchronization decision circuit of a Viterbi decoder comprising: an error counter for counting a number of errors of symbols over a fixed interval; a symbol counter for counting a number of symbols over the fixed interval; a trigger signal generator for producing a trigger signal every time the symbol counter counts up to a number of symbols which is externally set; a comparator for comparing, in response to the trigger signal supplied from the trigger signal generator, the number of errors counted by the error counter with a predetermined number of errors which is externally set, and for producing one of a synchronization signal indicating that code synchronization is established and a slip signal indicating that the code synchronization is not established; and a masking signal generator for generating a masking signal for suspending operation of the error counter and the symbol counter during a time while a code unsuitable as an input for counting the number of errors will be supplied.

Here, the masking signal generator may comprise a counter for carrying out count operation for an interval corresponding to a delay amount of the Viterbi decoder, and output the masking signal for suspending the operation of the error counter and the symbol counter during the count operation of the counter, wherein the interval corresponding to the delay amount of the Viterbi decoder may correspond to the time period in which the code unsuitable as the input for counting the number of errors will be supplied.

The masking signal generator may produce the masking signal for suspending the operation of the error counter and the symbol counter during a time period in which the code unsuitable as the input for counting the number of errors will be supplied, the time period beginning from a time immediately after one of an external reset signal and the slip signal is supplied, the slip signal being supplied from the comparator when the code synchronization is not established.

The masking signal generator may produce the masking signal for suspending the operation of the error counter and the symbol counter at an initial stage of each symbol measuring period of the symbol counter, the initial stage, during which the code unsuitable as the input for counting the number of errors will be supplied, beginning immediately after one of an external reset signal and the trigger signal is supplied, the trigger signal being supplied from the trigger signal generator.

BRIEF DESCRIPTION OF THE DRAWINGS

FIG. 5 is a timing chart illustrating timings of the code synchronization decision operation in a conventional code synchronization decision circuit of a Viterbi decoder.

DETAILED DESCRIPTION OF THE PREFERRED EMBODIMENTS

The invention will now be described with reference to the accompanying drawings.

EMBODIMENT 1

Figure 1:
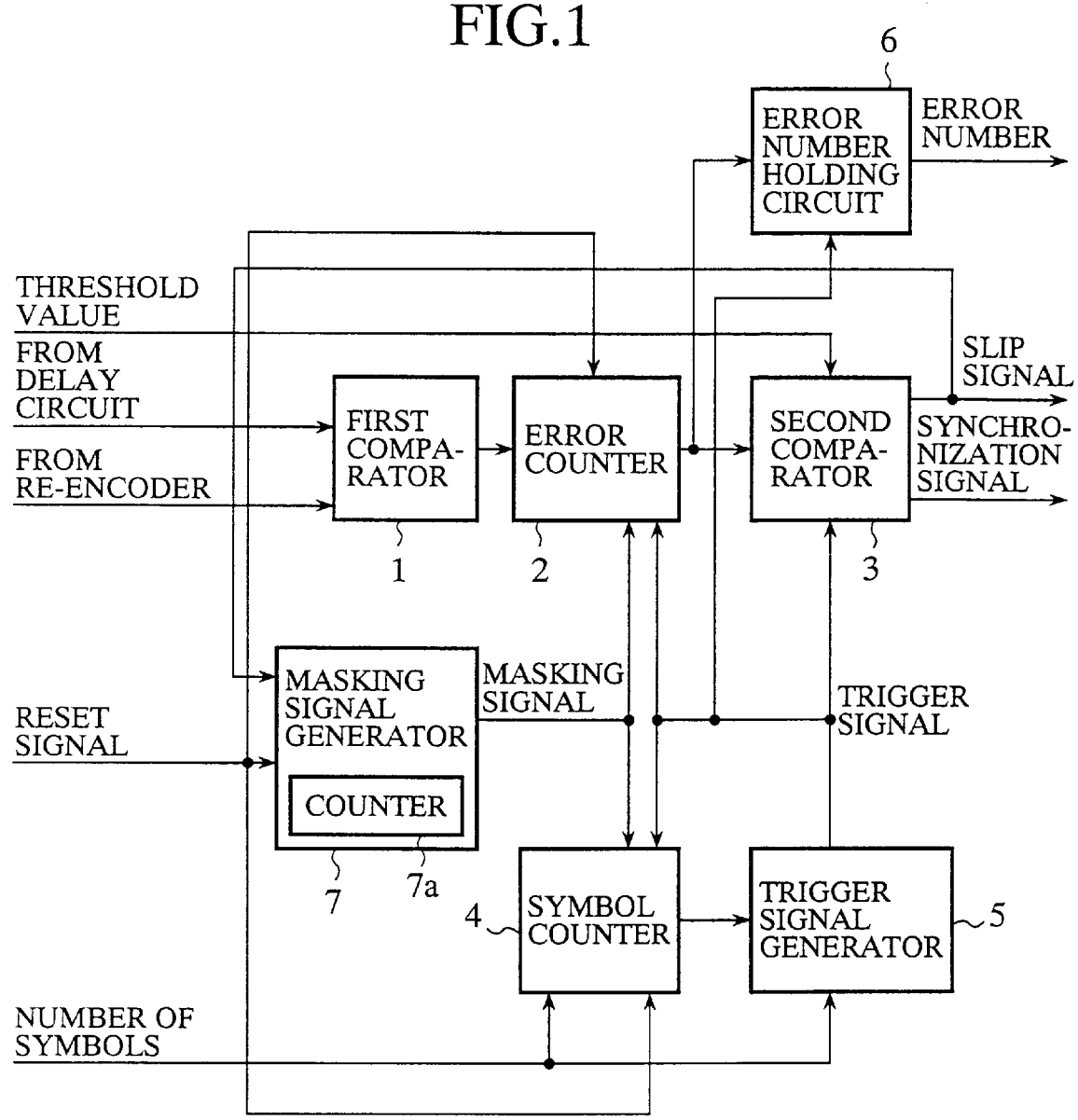
FIG. 1 is a block diagram showing an embodiment 1 of a code synchronization decision circuit of a Viterbi decoder in accordance with the present invention.

FIG. 1 is a block diagram showing an embodiment 1 of a code synchronization decision circuit of a Viterbi decoder in accordance with the present invention. In FIG. 1, the reference numeral 1 designates a first comparator that compares the output of a re-encoder with the output of a delay circuit, and produces a logical "1" signal when the compared result disagree with each other. Here, the re-encoder re-encodes, when obtaining synchronization information, the decoded output of the Viterbi decoder, and the delay circuit delays a signal to be decoded by an amount corresponding to a delay required by the Viterbi decoder for the decoding. The reference numeral 2 designates an error counter that counts the logical "1" output of the first comparator 1, and holds, when the counter output becomes all "1s", that output until a trigger signal or reset signal is supplied. The reference numeral 3 designates a second comparator that makes a decision in response to the trigger signal as to whether the code synchronization is established or not by comparing the output of the error counter 2 with an externally set threshold value, outputs a synchronization signal when the code synchronization is being established, and supplies a slip signal to a dummy symbol inserting circuit of the Viterbi decoder when the code synchronization is not being established.

The reference numeral 4 designates a symbol counter that counts the number of symbols up to an externally set symbol number, and 5 designates a trigger signal generator that generates the trigger signal when the output of the symbol counter 4 reaches the externally set symbol number. The reference numeral 6 designates an error number holding circuit that holds the count value of the number of errors counted by the error counter 2, and outputs the error number in the immediately previous symbol measuring period every time the next trigger signal is supplied. The reference numeral 7 designates a masking signal generator including a counter 7a. The masking signal generator 7 resets its counter 7a in response to the reset signal or the slip signal, and generates a masking signal for suspending the operation of the error counter 2 and symbol counter 4 while the counter 7a continues counting the delay amount of the Viterbi decoder.

Next, the operation of the present embodiment 1 will be described.

In a digital transmission system, some errors will take place in a received signal owing to noise or reflection occurring on a transmission path. Taking account of this, a transmission side carries out, before the transmission, error correcting encoding of information to be transmitted. Among error control schemes, the convolutional code is effective for random errors, and a Viterbi decoder using Viterbi algorithm is employed for decoding the convolutional code.

The convolutional code used in the digital transmission system includes various types from the convolutional code with a constraint length of K and a coding rate of ½, to that which is subjected to punctured coding with a higher coding rate of (n−1)/n. Here, the punctured code is obtained by decimating convolutional codes from a few places in a convolutional code sequence with the coding rate of ½ in accordance with a certain rule, and when carrying out the Viterbi decoding with the Viterbi decoder, dummy symbols are inserted by the dummy symbol inserting circuit to those places from which the convolutional codes are decimated.

The code synchronization must be established for the Viterbi decoder to achieve correct decoding of the convolutional code subjected to such punctured coding. Thus, the second comparator 3 of the code synchronization decision circuit supplies the dummy symbol inserting circuit with the slip signal notifying that the code synchronization is not established. The dummy symbol inserting circuit shifts its dummy symbol inserting position every time the slip signal is supplied.

Whether the code synchronization is established or not in the Viterbi decoder is decided depending on whether the number of errors of the symbols exceeds a predetermined error number (threshold value). The number of errors is obtained by comparing, over a predetermined number of symbols, the convolutional code a convolutional encoder (re-encoder) produces by re-encoding the Viterbi decoded output with symbols a delay circuit produces by delaying the input to the Viterbi decoder, and the code synchronization decision circuit makes that decision. Specifically, in the code synchronization decision circuit of the Viterbi decoder, the error counter 2 counts the number of errors over a fixed symbol measuring period, and the second comparator 3 compares the count value with the predetermined value. As a result, if the count value is equal to or less than the threshold value, the second comparator 3 makes a decision that the code synchronization is established, considering that the dummy symbol inserting position is correct, whereas if the count value is greater than the threshold value, it makes a decision that the code synchronization is not established, considering that the dummy symbol inserting position is incorrect.

This utilizes the fact that if the code synchronization is not established and the Viterbi decoder cannot carry out decoding correctly, the number of errors increases, whereas if the code synchronization is established, the number of errors decreases. Here, the delay amount of a delay circuit for delaying the input signal to the Viterbi decoder equals the delay amount needed for the input signal to be decoded and re-encoded. The code synchronization decision circuit of the Viterbi decoder allows its symbol number and threshold value to be set externally. A user sets them considering the characteristics of the transmission path.

In such a Viterbi decoder, immediately after the start of the operation or during a slipped state in which the synchronization is not established, the Viterbi decoder outputs unstable decoded results over a time period corresponding to the delay in the Viterbi decoder, and hence the re-encoder produces an output unsuitable for the value to be compared with the input signal. Thus, a masking period is provided for suspending the operation of the error counter 2 and symbol counter 4 from a time immediately after the start of the operation or the detection of the slip signal up to a time when the re-encoder stops producing the signal unsuitable as the input for counting the number of errors.

Figure 2:
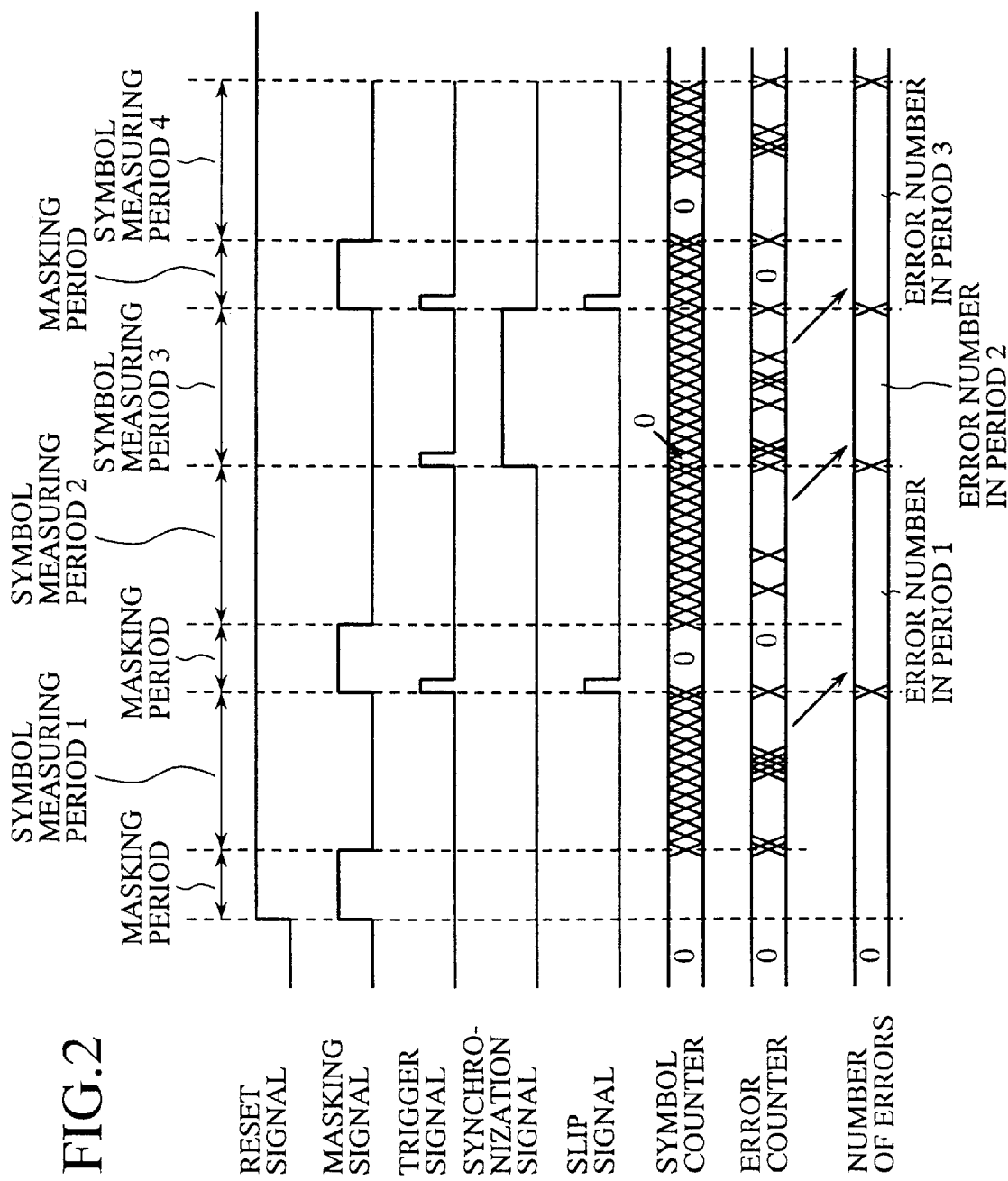
FIG. 2 is a timing chart illustrating timings of the code synchronization decision operation in the embodiment 1.

FIG. 2 is a timing chart illustrating timings of the code synchronization decision operation in the embodiment 1 of the code synchronization decision circuit of the Viterbi decoder. The operation of the code synchronization decision circuit of the Viterbi decoder will now be described in detail with reference to FIG. 2.

First, the first comparator 1 compares the output of the delay circuit for delaying the input to the Viterbi decoder with the output of the re-encoder for re-encoding the decoded output of the Viterbi decoder. As a result, if the two agree with each other, the first comparator 1 outputs a logical "0" indicating agreement, and if not, it outputs a logical "1" indicating disagreement, and supplies the output to the error counter 2. Here, if the input to the Viterbi decoder is a soft decision signal consisting of N bits, the bits representing the symbol are delayed. Receiving a signal indicating the compared result from the first comparator 1, the error counter 2 counts the number of the logical "1s". In the course of this counting, if the output of the error counter 2 becomes all "1s", the error counter 2 holds it until the next trigger signal is supplied from the trigger signal generator 5 or the external reset signal is supplied from the outside. The error counter 2 suspends its operation while it is supplied with the masking signal from the masking signal generator 7.

Being supplied with the trigger signal from the trigger signal generator 5, the second comparator 3 compares the output of the error counter 2 with the externally set threshold value. As a result, if the error number is less than the threshold value, it decides that the code synchronization is established, and supplies a synchronization signal to the dummy symbol inserting circuit of the Viterbi decoder. In contrast, if the error number is equal to or greater than the threshold value, it decides that the code synchronization is not established, and supplies the slip signal to the dummy symbol inserting circuit. The dummy symbol inserting circuit continues its operation if the synchronization signal is supplied from the second comparator 3, whereas it shifts the dummy symbol inserted position each time the slip signal is supplied.

The symbol counter 4 continues to count the number of symbols up to the externally set symbol number, and is reset when it counts up to that number. In the course of this, the symbol counter 4 suspends its counting as long as it is supplied with the masking signal from the masking signal generator 7. If the count value of the symbol counter 4 reaches the externally set symbol value, the trigger signal generator 5 generates a trigger signal, and supplies it to the error counter 2, second comparator 3, symbol counter 4 and error number holding circuit 6. Every time the trigger signal is input from the trigger signal generator 5, the error number holding circuit 6 outputs as the error number the count value the error counter 2 counted in the immediately previous symbol measuring period. The error number holding circuit 6 holds the output until the next trigger signal is input.

The masking signal generator 7 includes a counter 7a, resets the counter 7a in response to the reset signal externally supplied or the slip signal supplied from the second comparator 3, and produces the masking signal as long as the counter 7a continues counting up to the delay amount of the Viterbi decoder. The masking signal generator 7 outputs the masking signal during its counting as illustrated in FIG. 2, and supplies it to the error counter 2 and symbol counter 4. Thus, the error counter 2 and symbol counter 4 suspend their operation during the masking interval, in which the code unsuitable as the input for counting the number of errors will be supplied from the re-encoder to the code synchronization decision circuit immediately after the external reset signal or the slip signal which is output when the code synchronization is not established.

As a result, the present embodiment 1 can count the error number correctly, and this enables the user to set the threshold value and the symbol number correctly and easily. In addition, since the error number is counted correctly, the user can easily learn the type of errors occurring on the transmission path, and this offers an advantage that the errors are not confused with bugs while executing logic simulations using a register transfer level (called RTL below) or net list. Moreover, since the useless operation is avoided of the error counter 2 and symbol counter 4 during the interval in which the code unsuitable as the input for counting the number of errors will be supplied, an advantage is achieved of being able to make effective use of the power.

EMBODIMENT 2

Although the operation of the error counter 2 and symbol counter 4 is suspended only during the interval that begins immediately after the start of the operation of the code synchronization decision circuit or the detection of the slip signal, and that continues while the signal unsuitable as the input for counting the number of errors is supplied, they can be suspended every time the subsequent symbol measuring period is started after the pervious symbol measuring period, for a time period corresponding to the delay amount of the Viterbi decoder.

Figure 3:
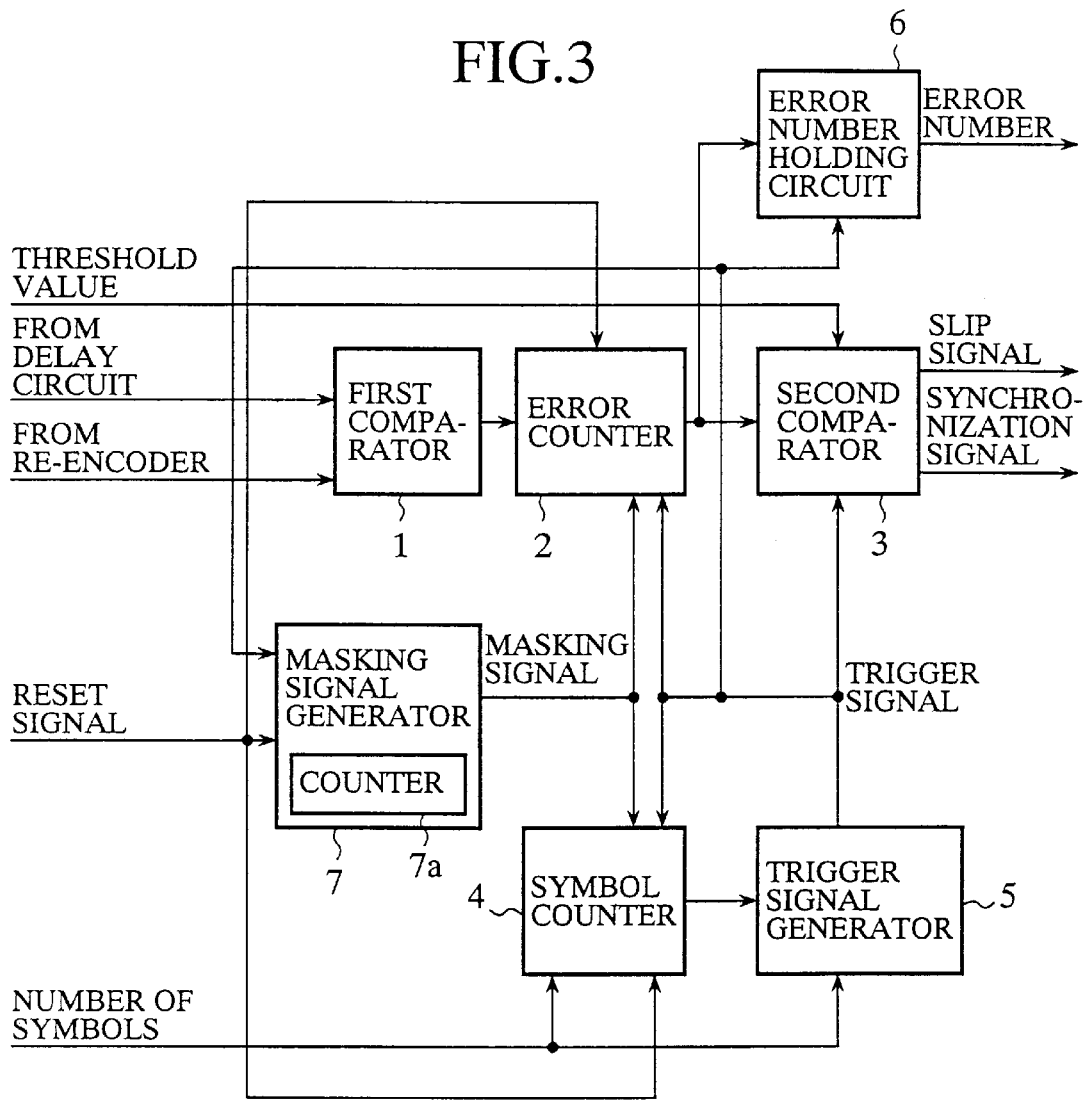
FIG. 3 is a block diagram showing an embodiment 2 of the code synchronization decision circuit of the Viterbi decoder in accordance with the present invention.

FIG. 3 is a block diagram showing such an embodiment 2 of a code synchronization decision circuit of a Viterbi decoder in accordance with the present invention. In FIG. 3, the reference numeral 1 designates a first comparator 1, 2 designates an error counter, 3 designates a second comparator, 4 designates a symbol counter, 5 designates a trigger signal generator, and 6 designates an error number holding circuit, all of which correspond to those of FIG. 1 which are designated by the same reference numerals. Likewise, as in the embodiment 1 shown in FIG. 1, the reference numeral 7 designates a masking signal generator that includes a counter 7a, and produces the masking signal for suspending the operation of the error counter 2 and symbol counter 4 from the time when the counter 7a is reset to the time when the counter 7a counts up the delay amount. The masking signal generator 7, however, differs from that of the foregoing embodiment 1 in that it is supplied with the trigger signal from the trigger signal generator 5 instead of the slip signal from the second comparator 3, so that the counter 7a is reset in response to the reset signal externally supplied or to the trigger signal.

Next, the operation of the present embodiment 2 will be described.

Figure 4:
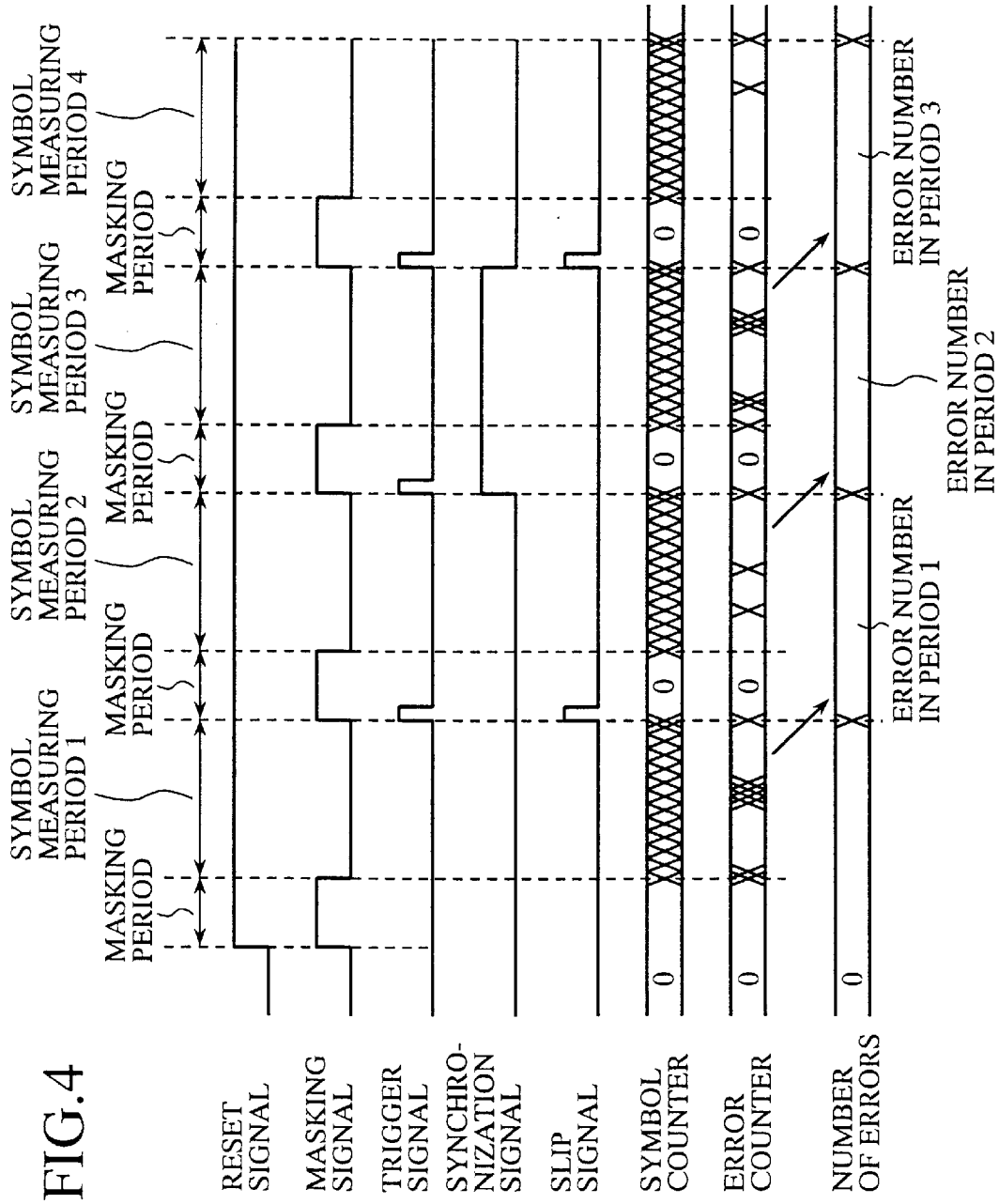
FIG. 4 is a timing chart illustrating timings of the code synchronization decision operation in the embodiment 2.

FIG. 4 is a timing chart illustrating timings of the code synchronization decision operation in the embodiment 2 of the code synchronization decision circuit of the Viterbi decoder. The operation of the code synchronization decision circuit of the Viterbi decoder will now be described with reference to FIG. 4.

First, the first comparator 1 compares the output of the delay circuit for delaying the input to the Viterbi decoder with the output of the re-encoder of the Viterbi decoder. As a result, if the two disagree with each other, the first comparator 1 outputs a logical "1" and supplies the output to the error counter 2. Here, if the input to the Viterbi decoder is a soft decision signal consisting of N bits, the bits representing the symbol are delayed. Receiving the signal indicating the compared result from the first comparator 1, the error counter 2 counts the number of the logical "1s". In the course of this counting, if the output of the error counter 2 becomes all "1s", the error counter 2 holds it until the next trigger signal is supplied from the trigger signal generator 5 or external reset signal is supplied from the outside. The error counter 2 halts its operation while it is supplied with the masking signal from the masking signal generator 7.

Being supplied with the trigger signal from the trigger signal generator 5, the second comparator 3 compares the output of the error counter 2 with the externally set threshold value. As a result, if the error number is less than the threshold value, it decides that the code synchronization is established, and supplies the dummy symbol inserting circuit of the Viterbi decoder with a synchronization signal, whereas if the error number is equal to or greater than the threshold value, it supplies the dummy symbol inserting circuit with the slip signal. The dummy symbol inserting circuit of the Viterbi decoder continues its operation if the synchronization signal is supplied from the second comparator 3, but shifts the dummy symbol inserted position each time the slip signal is supplied. On the other hand, the symbol counter 4 continues to count the number of symbols up to the externally set symbol number, and is reset when it counts up to that number. In the course of this, the symbol counter 4 suspends its counting as long as it is supplied with the masking signal from the masking signal generator 7.

If the count value of the symbol counter 4 reaches the externally set symbol value, the trigger signal generator 5 generates a trigger signal, and supplies it to the error counter 2, second comparator 3, symbol counter 4, error number holding circuit 6 and masking signal generator 7. Every time the trigger signal is input from the trigger signal generator 5, the error number holding circuit 6 outputs as the error number the count value the error counter 2 counted in the immediately previous symbol measuring period. The error number holding circuit 6 holds the output until the next trigger signal is input. The operation so far is similar to that of the embodiment 1.

The masking signal generator 7 includes a counter 7a, resets the counter 7a in response to the reset signal externally supplied or to the trigger signal supplied from the trigger signal generator 5, and produces the masking signal as long as the counter 7a continues counting up to the delay amount of the Viterbi decoder. The masking signal output from the masking signal generator 7 is supplied to the error counter 2 and symbol counter 4. Thus, the error counter 2 and symbol counter 4 suspend their operation while the masking signal is being supplied, that is, during an initial period of each symbol measuring period, in which the code unsuitable for the error counting will be supplied from the re-encoder to the code synchronization decision circuit immediately after the external reset signal or the trigger signal is produced.

As a result, in the present embodiment 2, the masking interval is provided to the initial portion of each symbol measuring interval immediately after the externally reset signal is input or the trigger signal is input from the trigger signal generator 5. This offers an advantage of being able to make better use of the power by obviating the useless operation of the error counter 2 and symbol counter 4 in the initial stage of each symbol measuring period.

What is claimed is:

1. A code synchronization decision circuit of a Viterbi decoder comprising:

an error counter for counting a number of errors of symbols over a fixed interval;

a symbol counter for counting a number of symbols over the fixed interval;

a trigger signal generator for producing a trigger signal every time said symbol counter counts up to a number of symbols which is externally set;

a comparator for comparing, in response to the trigger signal supplied from said trigger signal generator, the number of errors counted by said error counter with a predetermined number of errors which is externally set, and for producing one of a synchronization signal indicating that code synchronization is established and a slip signal indicating that the code synchronization is not established; and a masking signal generator for generating a masking signal for suspending operation of said error counter and said symbol counter during a time period in which a code unsuitable as an input for counting said number of errors will be supplied.

2. The code synchronization decision circuit of the Viterbi decoder as claimed in claim 1, wherein said masking signal generator comprises a counter for carrying out count operation for an interval corresponding to a delay amount of said Viterbi decoder, and outputs the masking signal for suspending the operation of said error counter and said symbol counter during the count operation of said counter, and wherein said interval corresponding to the delay amount of said Viterbi decoder corresponds to said time period in which the code unsuitable as the input for counting said number of errors will be supplied.

3. The code synchronization decision circuit of the Viterbi decoder as claimed in claim 2, wherein said masking signal generator produces the masking signal for suspending the operation of said error counter and said symbol counter during a time period in which the code unsuitable as the input for counting said number of errors will be supplied, said time period beginning from a time immediately after one of an external reset signal and the slip signal is supplied, said slip signal being supplied from said comparator when the code synchronization is not established.

4. The code synchronization decision circuit of the Viterbi decoder as claimed in claim 2, wherein said masking signal generator produces the masking signal for suspending the operation of said error counter and said symbol counter at an initial stage of each symbol measuring period of said symbol counter, said initial stage, during which the code unsuitable as the input for counting said number of errors will be supplied, beginning immediately after one of an external reset signal and the trigger signal is supplied, said trigger signal being supplied from the trigger signal generator.

5. The code synchronization decision circuit of the Viterbi decoder as claimed in claim 1, wherein said masking signal generator produces the masking signal for suspending the operation of said error counter and said symbol counter during a time period in which the code unsuitable as the input for counting said number of errors will be supplied, said time period beginning from a time immediately after one of an external reset signal and the slip signal is supplied, said slip signal being supplied from said comparator when the code synchronization is not established.

6. The code synchronization decision circuit of the Viterbi decoder as claimed in claim 1, wherein said masking signal generator produces the masking signal for suspending the operation of said error counter and said symbol counter at an initial stage of each symbol measuring period of said symbol counter, said initial stage, during which the code unsuitable as the input for counting said number of errors will be supplied, beginning immediately after one of an external reset signal and the trigger signal is supplied, said trigger signal being supplied from the trigger signal generator.

* * * * *